United States Patent [19]
Babb et al.

[11] Patent Number: 5,844,417
[45] Date of Patent: Dec. 1, 1998

[54] SIMULATED INFINITE GROUND SCREEN IN AN RF TEST CHAMBER

[75] Inventors: Samuel M. Babb, Ft. Collins; Lowell E. Kolb, Loveland, both of Colo.

[73] Assignee: Hewlett-Packard Company, Palo Alto, Calif.

[21] Appl. No.: 792,466

[22] Filed: Jan. 31, 1997

[51] Int. Cl.$^6$ .................................................. G01R 27/28
[52] U.S. Cl. .................. 324/627; 174/35 R; 174/35 MS
[58] Field of Search ............................. 324/627, 158.1; 174/35 R, 35 MS

[56] References Cited

U.S. PATENT DOCUMENTS

| | | | |
|---|---|---|---|
| 4,869,970 | 9/1989 | Gulla et al. | 174/35 MS |
| 5,053,712 | 10/1991 | Hansen | 324/627 |
| 5,603,196 | 2/1997 | Sohlstrom | 174/35 MS |

*Primary Examiner*—Glenn W. Brown
*Attorney, Agent, or Firm*—Edward L. Miller

[57] ABSTRACT

The degree of variation in the normalized site attenuation of an RF test chamber may be reduced by adjusting the properties of the RF absorbers lining the walls of the RF test chamber such that for the frequencies of greatest variation the ground screen formed by the conductive floor of the chamber appears to be much greater than its actual finite size. This may be done by progressively reducing the degree of chamber wall absorption (for the frequencies of interest) for locations on the walls closer to the floor. The reduction begins at a height above the floor equal to the height of the device under test above the floor, and proceeds to some maximum reduction in absorption at the level of the floor. The reduction in absorption has the effect of making the ground screen appear to be much larger than it really is, and may be obtained either by spacing the absorbing tiles apart by increasing amounts nearer to the floor, or by using less absorptive tiles closer to the floor, or both.

4 Claims, 5 Drawing Sheets

SIMULATED INFINITE GROUND SCREEN IN AN RF TEST CHAMBER

BACKGROUND OF THE INVENTION

The FCC in the United States and other regulatory bodies in foreign jurisdictions require that manufacturers of certain classes of electronic equipment test and certify that radio frequency emissions from that equipment are within prescribed limits. Examples are 47 CFR, parts 2 and 15 for the United States, and CISPR Publications 11 and 22 for Europe and much of the rest of the world. Elaborate procedures are specified to establish the conditions under which the various measurements are to be made. Often, the measurements are made in an RF test chamber. The inside walls of the RF test chamber are covered with material that absorbs propagating radio frequency energy. Typically, cones of carbon loaded foam are used for the higher frequencies, while tiles of ferrite material is used for the lower frequencies. This is done to produce an anechoic environment so that energy radiating from the device under test contributes to a measurement only once, and not multiple times through reflections. Another of the principal benefits expected from the RF chamber is removal from the measured results of those signals that do not originate from the device under test. This is important, because there is no regulatory provision for the analytical "correction" of measured values to be "what they would have been" had they been obtained under test conditions free of other signals.

However, to screen out external signals the RF test chamber has metal sides, a metal top, and generally a metal bottom as well. The metal bottom serves not only as a shield for external signals, but also as a counterpoise, or ground screen, for radiators and absorbers within the RF test chamber. While this shielding is effective in keeping unwanted external signals out, unless something is done to prevent it, measurements of signals originating on the inside (i. e., from the device under test) can be adversely affected by the finite size of the ground screen in the RF test chamber. In particular it can produce variations as a function of frequency in a measured property called "normalized site attenuation". (Normalized site attenuation is found by measuring actual measured antenna to antenna performance at a standard distance apart within the RF test chamber and then comparing that performance to an ideal behavior described by a model. Normalized site attenuation is used as a criterion for certifying that particular site is acceptable for official measurements.) These variations in normalized site attenuation show up as errors in measurements performed upon the device under test.

This increased variation in normalized site attenuation is most noticeable in the frequency range of 30 MHz to 100 MHz. The regulatory agencies have limits on what the variation can be, which imposes constraints on chamber design. Even if a chamber has an acceptable amount of variation, however, measurements made therein upon a product under test can still be adversely affected. The variation may make the measured values larger than they ought to be, and could cause a product being tested to fail when it ought to pass. It is also possible that a measured value could be less than it ought to be, which is not desirable, either.

It would be desirable if the low frequency variation in normalized site attenuation of RF test chambers could be improved, so that measurements of radiated radio frequency emissions in the 30 MHz to 100 MHz region are neither artificially high nor low, owing to variation in the normalized site attenuation for the RF test chamber. Such an improved situation has the potential of lowering the development costs of products that require certification.

SUMMARY OF THE INVENTION

The degree of variation in the normalized site attenuation of an RF test chamber may be reduced by adjusting the properties of the RF absorbers lining the walls of the RF test chamber such that for the frequencies of greatest variation the ground screen formed by the conductive floor of the chamber appears to be much greater than its actual (finite) size. This may be done by progressively reducing the degree of chamber wall absorption (for the frequencies of interest) for locations on the walls closer to the floor. The reduction begins at a height above the floor equal to the height of the device under test above the floor, and proceeds to some maximum reduction in absorption at the level of the floor. The reduction in absorption has the effect of making the ground screen appear to be much larger than it really is, and may be obtained either by spacing the absorbing tiles apart by increasing amounts nearer to the floor, or by using less absorptive tiles closer to the floor, or both.

DESCRIPTION OF A PREFERRED EMBODIMENT

Figure 1:
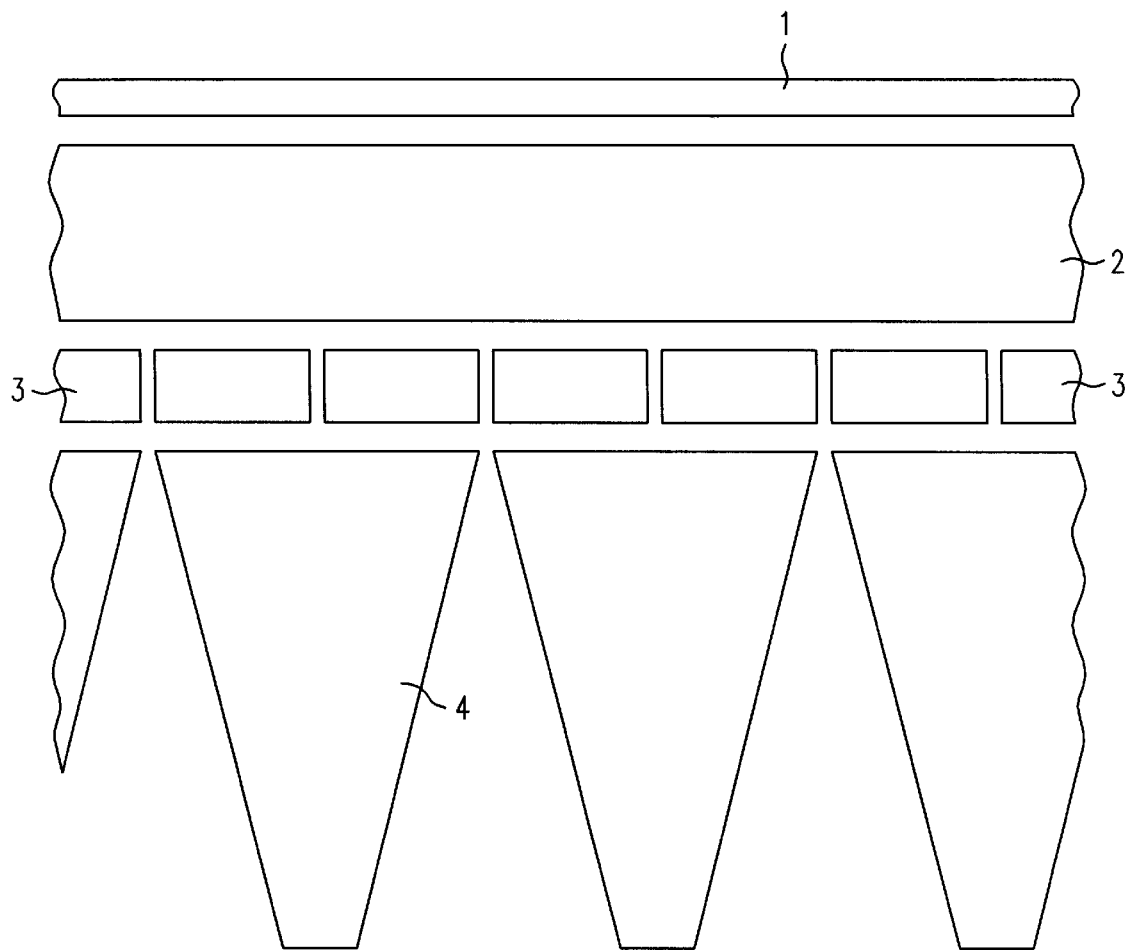
FIG. 1 is a simplified representation of how RF absorbing material is conventionally applied to a wall in an RF test chamber.

Refer now to FIG. 1, wherein is shown a simplified representation 1 of a segment of conventional RF absorbing material applied to the interior surface of a wall or ceiling of an RF test chamber. In particular, a conductive metallic surface 1 (e.g., sheeting of copper or steel) is (optionally) faced with a spacer material 2 (e.g., plywood), which is in turn covered with ferrite tiles 3. The ferrite tiles 3 may be squares ten centimeters on a side, and perhaps five to six millimeters thick. The exposed surface of the ferrite tiles 3 carries cones 4 of RF absorbing material (e.g., carbon loaded plastic foam). The cones 4 are frequently truncated, although sometimes they are not. The cones 4 may vary in length; the typical range is from 30 to 150 cm. Cones of various different lengths may be used (intermixed) in an installation. The plywood spacer is optional, and may be thought of as a tuning element that affects the degree of RF absorption at or about some frequency of interest. Typical thicknesses for the plywood spacer 2 are in the range of one quarter to three quarters of an inch. Not shown are any structural elements (studs, headers, joists, cross braces, etc.) which serve to define the shape of the RF test chamber, give it needed structural strength and rigidity, and that also holds the metallic sheeting in place.

Those interested in more information about RF absorbing tiles and cones may consult the commercial literature, such as the brochure BDE-004A from the TDK corporation of Japan, and similar publications from the TOYO corporation, also of Japan.

It will be understood that the cones 4 need not actually be conical in shape; some manufacturer's designs employ other tapered shapes, such a (truncated or not) pyramid.

The geometry and component parameters of the arrangement shown in FIG. 1 may be "peaked" at the low end frequencies of say, 30 MHz to 45 MHz, so that the fall-off at the true low end below 30 MHz is prevented until as low a frequency as practical. In any event, the arrangement shown in FIG. 1 indicates tiles 3 that are placed uniformly over the entire surface of the wall. Typically, they are placed so that they abut each other in both the vertical and horizontal directions. That is, they typically cover the entire surface to which they are applied.

Figure 2:
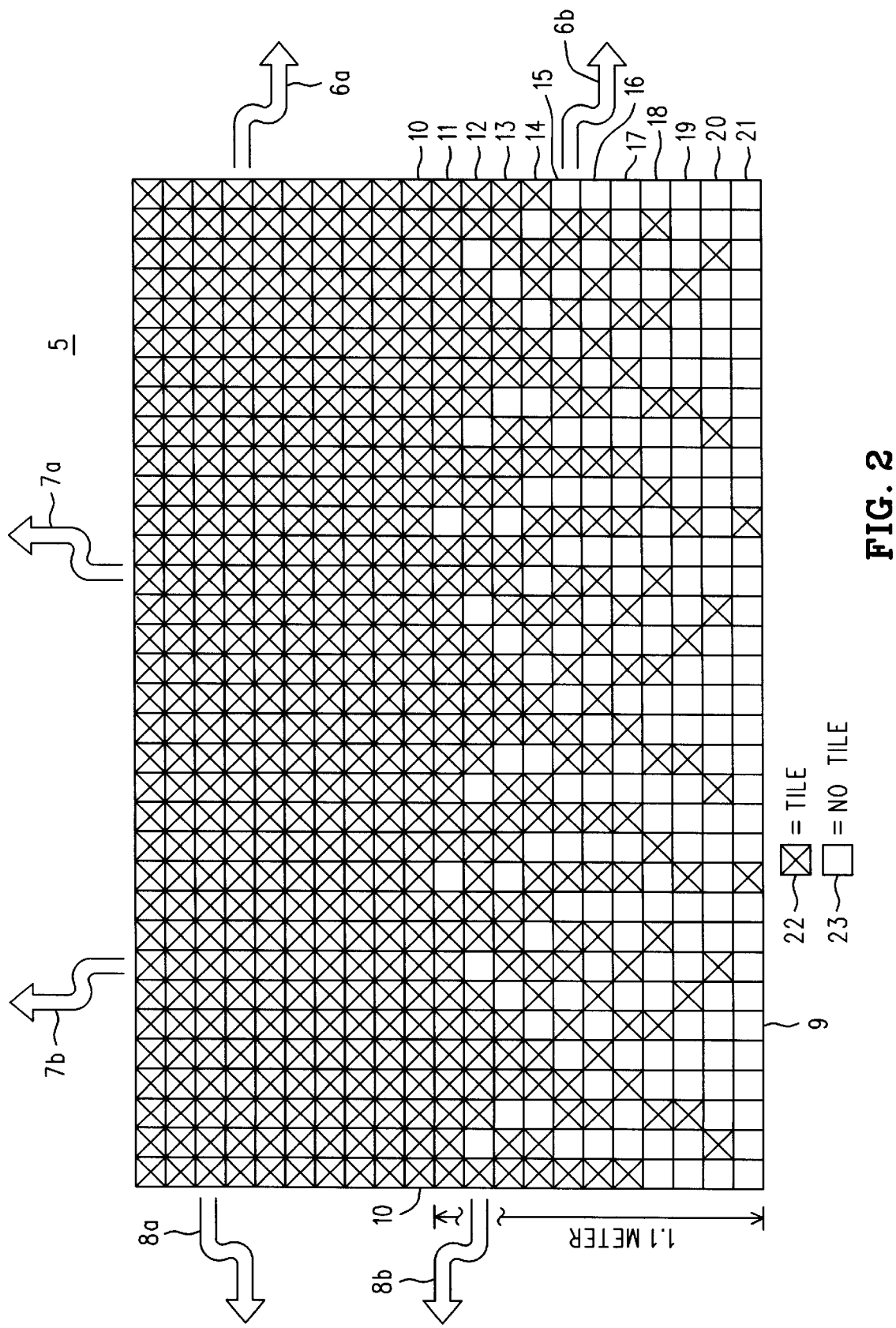
FIG. 2 is a frontal view of the placement of ferrite tiles upon the surface of a side wall for an RF chamber whose ground screen (conductive floor) simulates a counterpoise much larger than its actual physical size.

Refer now to FIG. 2, wherein is shown a frontal view of the placement of tiles 3 upon a portion of the surface of a side wall 5 for an RF chamber whose ground screen (conductive floor at level 9) simulates a counterpoise much larger than its actual physical size. The view shown is as it would appear if the cones 4 were removed, or perhaps before they are installed.

As stated above, RF test chambers come in all sizes, so we cannot say that the side wall 5 will be of any particular size. This is indicated by the various squiggly arrows. Arrows 6a and 6b denote that the right edge of the drawing in the figure is not necessarily the real right edge. Likewise, arrows 7a and 7b indicate that the ceiling is not at any particular height, while arrows 8a and 8b denote generality for the location of the left edge of the side wall 5. Line 9 indicates the level of the top surface of the conductive floor, which in this view would appear to be on edge.

The drawing in FIG. 2 is composed of a pattern of boxes with X's in them 22 and boxes without X's 23. The boxes having the X's 22 denote the presence of ferrite tiles 3. The boxes without X's 23 denote the absence of a tile 3. In this example we assume that the ferrite tiles 3 are squares, ten centimeters on a side. This, of course, is purely exemplary, as other sizes of tiles may be used. As will become clear, however, smaller tiles allow a finer granularity in reducing the absorptive effect of the tiles 3 at levels progressively close to the floor 9.

Note line 10 in FIG. 2. It is at a height 1.1 meters above the level of the floor 9. This particular value was chosen for testing computer workstation equipment. The testing standards specify that the top surface of the table upon which table mounted equipment shall be tested is 0.8 meters above the floor. The "effective center" of the RF radiating from the type equipment contemplated for testing in the instant chamber is, on average, about 0.3 meters above the bottom of its case. Hence, above 1.1 meters (line 10) the side wall 5 has a conventional covering of ferrite tiles 3. That is, above line 10 the tiles 3 abut each other in all directions within the plane of the side wall 5. Below line 10 the absorptive effect of the tiles 3 is progressively reduced as the floor 9 is approached. We believe that the height of line 10 above the floor 9 can vary, say, by ten or fifteen percent of its "ideal" value without producing a severe effect in the results. It will be appreciated that the height of 1.1 meters for line 10 is a matter of choice.

At this point we can turn our attention to the bottom eleven rows of tiles 11–21. In the example of FIG. 2 these bottom eleven rows 11–21 are part of groups or blocks of tiles 3 that are twelve tiles across and eleven tiles high. In row eleven there are eleven tiles for every twelve spaces. In row 12 there are ten tiles for every twelve spaces, and the missing tiles are regularly and equally spaced apart (five tiles and a space, five tiles and a space, etc.). The remaining rows are similar: row 13 has nine tiles for every twelve spaces, with the locations for absent tiles spread apart regularly, and as equally as possible. Row 14 has eight tiles for every twelve spaces, and so on, until row 21 has but one tile for every twelve spaces.

The eleven rows arise because of the choice of 1.1 meters and tiles 3 that are ten centimeters on a side. The twelve locations across in a group arises because it is one more than eleven. That choice produces a pattern in the reduction of tile presence that avoids a row (not shown) right above the floor that has no tiles. Said another way, if we used a pattern of twelve by twelve there would be a bottom-most row that had no tiles. If one indeed wanted that, then that is what one would do, although with smaller tiles or with a line 1.2 meters above the floor.

Figure 3:
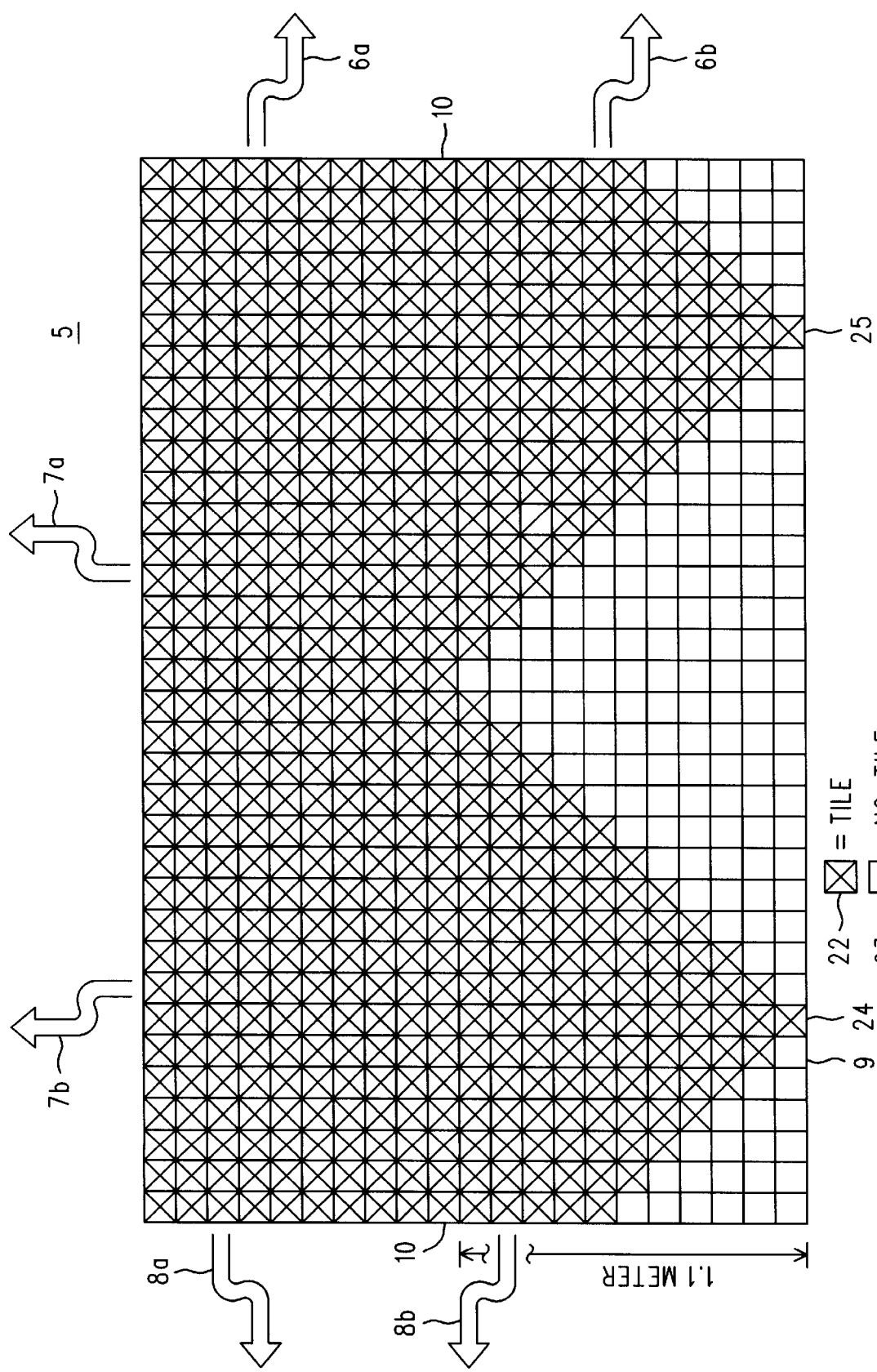
FIG. 3 is a frontal view, similar to FIG. 2, but for a different pattern.

The pattern of tiles below line 10 shown in FIG. 2 has certain properties that are of interest. Note that there are no places where a column has all tiles or all absences. At each of the rows 11–21 the effective absorption (viewed horizontally) is steady over the cycle length of the pattern, and is the same for consecutive cycles of the pattern at that height. But for each lower row that effective absorption decreases. FIG. 3 is a contrasting example of another arrangement of tiles grouped into two triangular patterns 24 and 25.

Figure 4:
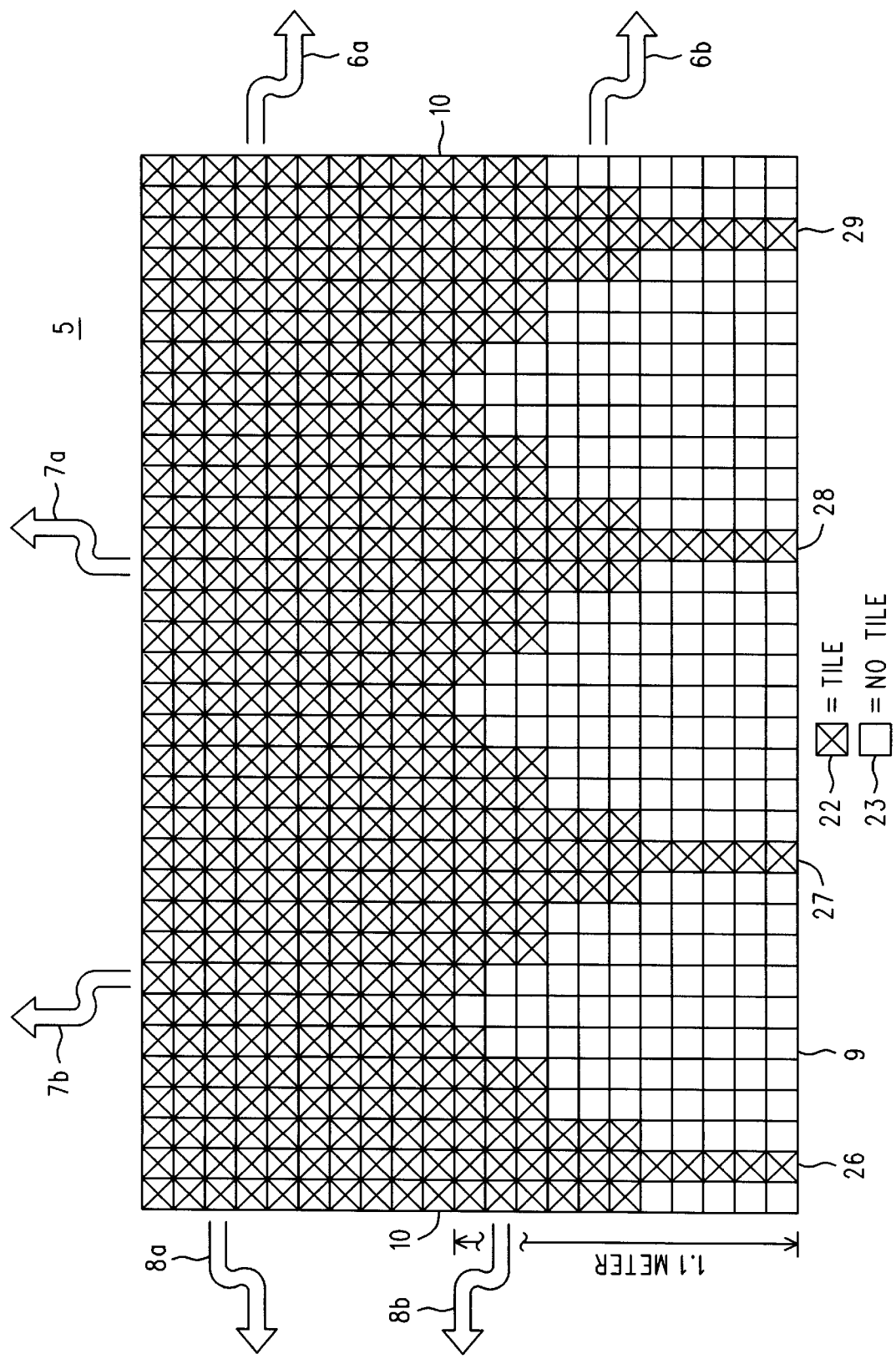
FIG. 4 is a frontal view, similar to FIG. 2, but for still another pattern.

In the patterns shown in FIGS. 2 and 3 the degree of effective absorption decreases linearly, although each has a different number of absent tiles per cycle in the group per lower row. It may be desirable for the decrease in absorption to occur in a non-linear fashion. FIG. 4 is an example of just such a non linear decrease in the degree of effective absorption.

In FIG. 4 there are a number of patterns 26, 27, 28 and 29 that exhibit varying slopes along their edges as the rows in question are nearer to the floor 9. In particular, those slopes are 1:1, 2:1, 3:2 and 5:1. These slopes arise by looking at the boxes without X's that adjoin one side of the pattern. In this case the 1, 2, 3 and 5 combine to occupy the eleven rows (in this example) available for manifesting the pattern.

Figure 5:
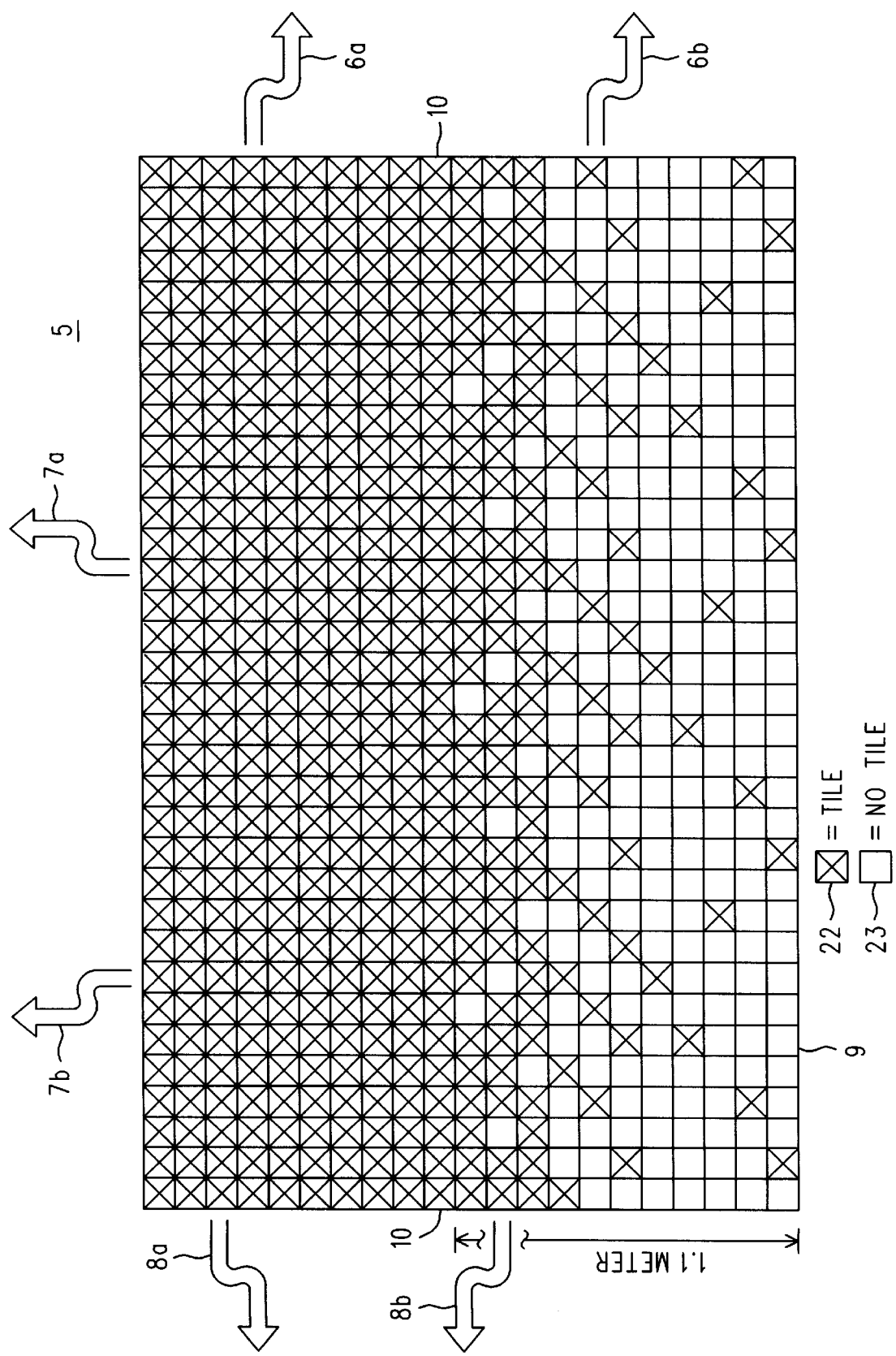
FIG. 5 is a frontal view, similar to FIG. 2, showing a rearrangement of the pattern of FIG. 4.

The arrangement shown in FIG. 4 may be more useful if the tiles within the patterns 26, 27, 28 and 29 can be horizontally redistributed within their rows, such that the average decrease in density of absorber (the tiles 3) remains as in FIG. 4, but that the vertical grouping into columns and the large contiguous patches of no tiles 23 are broken up. FIG. 5 is such a rearrangement of FIG. 4.

FIGS. 4 and 5 show decreases in absorber density that exhibit an increasing rate of decrease as the floor is approached. The rate of decrease could become smaller as the floor is approached. This would produce tile patterns that (if "collected" as in FIGS. 3 and 4 rather than "distributed" as in FIGS. 2 and 5) are rounded as they approach the floor, instead of pointed, as in the examples shown.

In closing, we wish to note that we show the pattern of decreasing absorption as occurring with the ferrite tiles 3; it should be remembered that the cones 4 remain as in a conventional RF test chamber. The reason that the ferrites are used is that they are the ones that absorb the lower frequencies, and it is those that are of interest because the fringing effects arising from the finite ground screen are most pronounced at the lower frequencies.

Lastly, we do not offer a formula that promises to specify the decrease in absorber density as a function of chamber properties. RF test chambers come with such a variety of properties that such a goal is unreachable. Those skilled in the art will be adequately guided by the recognition herein that decreasing density of absorber will ameliorate the ill effects on normalized site attenuation caused at low frequencies by a finite ground screen.

We claim:

1. A method of disposing on the walls of an RF test chamber material that absorbs radio frequency energy, the method comprising the steps of:

(a) determining a height H above the floor of the RF test chamber generally equal to the height above the floor of the equivalent center of radiation from a device under test; and (b) beginning at the height H, decreasing the effective amount of absorption for heights less than H.

2. A method as in claim 1 wherein the decrease of step (b) is linear.

3. A method as in claim 1 wherein the material is ferrite.

4. A method as in claim 3 wherein the ferrite is shaped as tiles and further comprising the steps of:

(c) placing the ferrite tiles below height H upon the walls according to a grid pattern of rows and columns; and (d) redistributing the tiles along the rows to avoid columns that, between the floor and the height H, are completely filled with adjacent tiles.

* * * * *